(12) United States Patent
Doi et al.

(10) Patent No.: US 6,933,820 B2
(45) Date of Patent: Aug. 23, 2005

(54) MAGNETIC CIRCUIT WITH OPPOSING PERMANENT MAGNETS AND METHOD FOR ADJUSTING MAGNETIC FIELD THEREOF

(75) Inventors: Yuhito Doi, Takefu (JP); Koji Miyata, Takefu (JP); Dai Higuchi, Takefu (JP)

(73) Assignee: Shin-Etsu Chemical Co., Ltd., (JP)

( * ) Notice: Subject to any disclaimer, the term of this patent is extended or adjusted under 35 U.S.C. 154(b) by 2 days.

(21) Appl. No.: 11/007,982

(22) Filed: Dec. 9, 2004

(65) Prior Publication Data
US 2005/0128037 A1 Jun. 16, 2005

(30) Foreign Application Priority Data
Dec. 10, 2003 (JP) .............................. 2003-411290

(51) Int. Cl.[7] .............................................. H01F 7/00
(52) U.S. Cl. ...................... 335/301; 335/296; 335/306; 324/319; 324/320
(58) Field of Search ......... 335/296–306; 324/318–320

(56) References Cited

U.S. PATENT DOCUMENTS

| | | | |
|---|---|---|---|
| 5,055,812 A | 10/1991 | Abele et al. | 335/210 |
| 5,089,798 A * | 2/1992 | Miyata | 335/211 |
| 5,229,723 A | 7/1993 | Sakurai et al. | 324/319 |
| 5,864,275 A * | 1/1999 | Ohashi et al. | 335/306 |
| 5,963,117 A * | 10/1999 | Ohashi et al. | 335/306 |

FOREIGN PATENT DOCUMENTS

| | | |
|---|---|---|
| JP | 1164356 | 6/1989 |
| JP | 5-87962 | 12/1993 |
| JP | 9056692 | 3/1997 |

* cited by examiner

*Primary Examiner*—Ramon M. Barrera
(74) *Attorney, Agent, or Firm*—Myers Bigel Sibley & Sajovec, P.A.

(57) ABSTRACT

It is an object of the present invention to facilitate adjustment of magnetic fields. There is provided a magnetic circuit with opposing permanent magnets, comprising: a pair of permanent magnets opposing each other across a gap, the pair of permanent magnets being magnetized in thickness direction; a yoke magnetically coupled to the permanent magnets, and provided outside of the permanent magnets and the gap; a pair of pole pieces each arranged on a gap side of an opposing surface of each of the permanent magnets and having a peripheral projection in opposing direction; and an adjustment permanent magnet piece having magnetic flux amount of at most $2 \times 10^{-7}$ Wb provided so as to magnetically communicate with a magnetic field formed in the gap.

3 Claims, 1 Drawing Sheet ered to MRI), the use of magnetic circuits with opposing permanent magnets utilizing rare earth magnets is well-established. As detailed below, such magnet opposing-type magnetic circuits include permanent magnets and a yoke for
MAGNETIC CIRCUIT WITH OPPOSING PERMANENT MAGNETS AND METHOD FOR ADJUSTING MAGNETIC FIELD THEREOF

RELATED APPLICATION

This application claims priority from Japanese Patent Application No. 2003-411290, filed Dec. 10, 2003, the disclosure of which is incorporated by reference herein in its entirety.

BACKGROUND OF THE INVENTION

1. Field of the Invention

The present invention relates to magnetic circuits with opposing permanent magnets and to methods for adjusting magnetic fields of such magnetic circuits.

2. Description of Related Art

For magnetic field generating devices using permanent magnets for magnetic resonance imaging apparatuses (also referred to MRI), the use of magnetic circuits with opposing permanent magnets utilizing rare earth magnets is well-established. As detailed below, such magnet opposing-type magnetic circuits include permanent magnets and a yoke for allowing a magnetic flux from the magnets to pass therethrough, and generally also include pole pieces that are preferably made of soft magnetic material such as soft iron, provided on surfaces of the permanent magnets in order to generate a uniform magnetic field in the gap between the permanent magnets. Usually, the magnetic field is adjusted by providing a holding plate of shim material, which is called a shim holder, on the pole piece, an inclined magnetic field coil or the like, and providing a shim member of such as the soft magnetic bodies or permanent magnet pieces thereon.

The clarity of MRI images is greatly affected by the uniformity of the magnetic field. Thus, when manufacturing MRI apparatuses, it is exceedingly important to arrange so as to easily obtain a uniform magnetic field.

Japanese Patent Provisional Publication No. H1-164356/1989 A, Japanese Patent Provisional Publication No. H9-56692/1997 A, Japanese Patent No. H5-87962/1993 B, all of which are herein incorporated by reference, and the like teach a method for adjusting a magnetic field using soft magnetic members or permanent magnets. For example, a method is shown in Japanese Patent Provisional Publication No. H1-164356/1989 A in which a plurality of small permanent magnet pieces for magnetic field adjustment are fastened by screws to a holding plate, which is arranged in proximity to the pole piece.

When using soft magnetic members for adjusting magnetic field, it is possible, for example by using thin plates of the soft magnetic members, to comparatively easily change the thickness and size thereof, and particularly it is also possible to prepare small members. On the other hand, it is more preferable to use permanent magnet pieces for adjusting the magnetic field than using the soft magnetic members because permanent magnet pieces can be used to adjustably weaken the magnetic field where necessary by using their polarity in a direction opposite to the principal magnetic field. However, up to now, the size of the magnet pieces, for example, that is actually used has not been specified, precisely what kind of magnet pieces should be used has not been clear, and fine adjustment of magnetic fields has been difficult.

SUMMARY OF THE INVENTION

In order to facilitate adjustment of the magnetic field using a permanent magnet it is preferable to prepare a multitude of permanent magnet pieces suitable for magnetic field adjustment. However, conventionally, there has been no disclosure of specifications of permanent magnets suitable for adjusting magnetic fields. Usually, permanent magnet pieces (magnet pieces in the order of $5\times10^{-6}$ Wb) of a size manageable by hand have been used, but in these cases, problems have occurred in which the permanent magnet pieces cause large change of uniformity of the magnetic field, and the magnetic field may have been difficult to adjust. Accordingly, it is an object of the present invention to show the conditions of suitable permanent magnet pieces for adjusting magnetic fields, so as to facilitate adjustment of magnetic fields.

In one aspect of the present invention, there is provided a magnetic circuit with opposing permanent magnets, comprising: a pair of permanent magnets opposing each other across a gap, the pair of permanent magnets being magnetized in thickness direction; a yoke magnetically coupled to the permanent magnets, and provided outside of the permanent magnets and the gap; a pair of pole pieces each arranged on a gap side of an opposing surface of each of the permanent magnets and having a peripheral projection in opposing direction; and an adjustment permanent magnet piece having magnetic flux amount of at most $2\times10^{-7}$ Wb provided so as to magnetically communicate with a magnetic field formed in the gap. Preferably the adjustment permanent magnet piece has a coercive force of at least 800 kA/m.

In another aspect of the invention, there is provided a method for adjusting a magnetic field of a magnetic circuit with opposing permanent magnets, the magnetic circuit comprising: a pair of permanent magnets opposing each other across a gap, the pair of permanent magnets being magnetized in thickness direction; a yoke magnetically coupled to the permanent magnets, and provided outside of the permanent magnets and the gap; and a pair of pole pieces each arranged on a gap side of an opposing surface of each of the permanent magnets and having a peripheral projection in opposing direction, and the method comprising a step of: providing an adjustment permanent magnet piece having magnetic flux amount of at most $2\times10^{-7}$ Wb so as to magnetically communicate with a magnetic field formed in the gap.

As is explained in detail below, according to the present invention, adjustment of a magnetic field of a permanent magnet opposing-type magnetic circuit is facilitated.

DEATILED DESCRIPTION OF PREFERRED EMBODIMENTS

Figure 1:
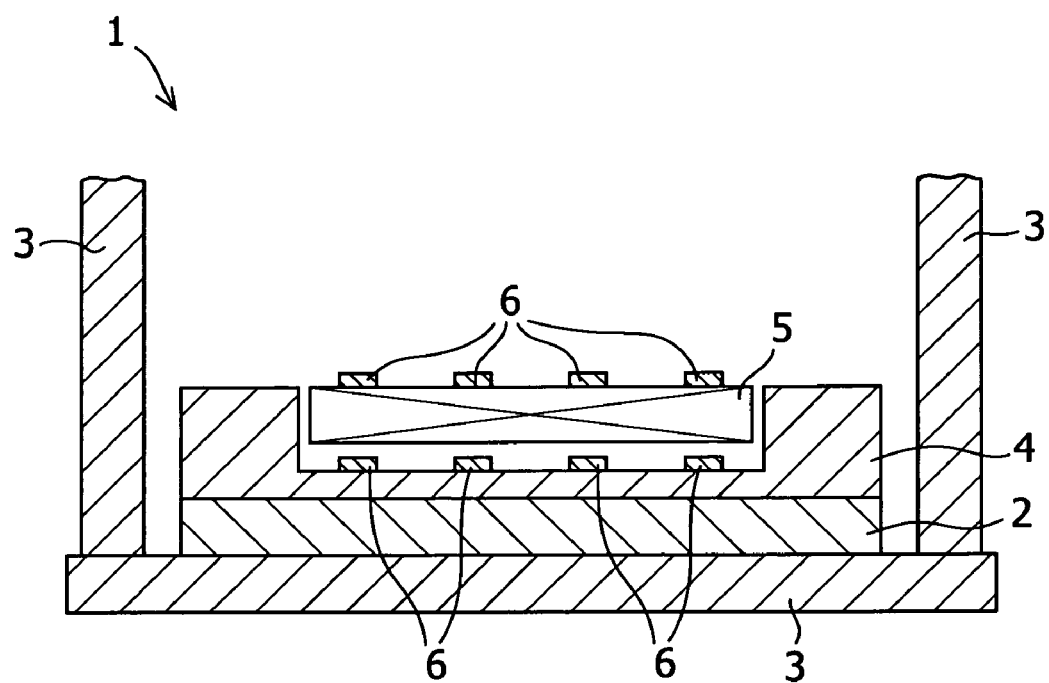
FIG. 1 shows a schematic view of a permanent magnet opposing-type magnetic circuit, according to an embodiment of the present invention.

An embodiment of the present invention is described below with reference to the attached drawing. Naturally, the embodiment that is described below does not limit the present invention. Rather, this embodiment is provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs. As described above, the present invention provides a permanent magnet opposing-type magnetic circuit wherein it is easy to adjust the uniformity of magnetic field thereof, and a method for adjusting the magnetic field of the permanent magnet opposing-type magnetic circuit.

FIG. 1 shows a schematic view of a permanent magnet opposing-type magnetic circuit, according to an embodiment of the present invention. FIG. 1 shows only the lower portion of the permanent magnet opposing-type magnetic circuit, since an upper portion and a lower portion of the permanent magnet opposing-type magnetic circuit can be symmetrical. However, even if the upper and lower portions are asymmetric, the present invention can be applied if the configuration is the same. As shown in FIG. 1, a permanent magnet opposing-type magnetic circuit 1 according to the present invention includes a pair of permanent magnets 2 opposing each other across a gap and magnetized in the thickness direction, a yoke 3 magnetically coupled to the permanent magnets and provided outside of the gap between the permanent magnets, and a pair of pole pieces 4 arranged on a gap side of an opposing surface of each of the permanent magnets and having a peripheral projection in opposing direction.

Since the permanent magnets 2 can be the same as conventional ones, a detailed description is hereby omitted. The pair of permanent magnets magnetized in the thickness direction is opposed across a gap to form the principal magnetic field in the gap. Particularly in the case of magnetic circuits used in MRI, the principal magnetic field generally has a magnetic field strength of at least 0.1 T. Although it is not a specific limitation, ferrite or rare earth magnets, for example, can be used as the permanent magnets, and it is preferable to use Nd—Fe—B-based, Sm—Co-based or Sm—Fe—N-based rare earth sintered magnets, which have a high energy product, because the required amount of magnet an be reduced, and it is possible to make the device smaller. The shape of the permanent magnets may be round or square, for example, and although it is not a specific limitation, it is preferable that the permanent magnets have the same shape as the pole pieces. The direction of magnetization is substantially perpendicular to the faces of the opposing permanent magnets (thickness direction), and generally points in the same direction. Particularly, in the magnetic circuit used in MRI, the permanent magnets for forming the principal magnetic field of the magnetic circuit are ordinarily configured by combination into a block that has a magnetic flux amount of at least $2\times10^{-3}$ Wb.

Since the yoke 3 can be the same as a conventional ones, a detailed description is hereby omitted. The yoke is provided outside of the gap between the permanent magnets, and magnetically couples the permanent magnets. Thus, a closed magnetic circuit is formed. There is not particular limitation to the shape of the yoke and it can be any, for example, it can be letter-C-shaped, square, or be shaped as two columns. More specifically, a pair of substantially parallel plate-shaped yokes can be supported by column-shaped yokes, and the permanent magnets can be provided on opposing faces of the plate-shaped yokes.

The pole pieces 4 may be the same as conventional ones and thus a detailed description is hereby omitted. The pair of pole pieces having a peripheral projection in opposing direction is arranged on a gap side of an opposing surface of each of the permanent magnets. This improves the uniformity of the magnetic field of the magnetic circuit. Namely, if a spherical or elliptical space (also referred to as an evaluation space) is theoretically provided in the central portion of the gap, and the uniformity of the magnetic field of the magnetic circuit is evaluated according to the magnetic field distribution in the evaluation space, then when the pole pieces are simple disk-shapes, the magnetic field strength at the equatorial portion of the evaluation space is lower than at the pole portions. On the other hand, if pole pieces is provided with peripheral projection, then the physical distance between the equatorial portion of the evaluation space and the peripheral projection is closer, the magnetic field strength increases at the equatorial portion, and thus the uniformity of the magnetic field improves across the entire evaluation space. Furthermore, in order to further improve the uniformity of the magnetic field, a plurality of small projections whose step is smaller than that of the peripheral projection can be provided on a periphery of a base portion of the pole pieces.

In order to generate an inclined magnetic field between the gap of the opposing pole pieces, a pair of inclined magnetic field coils 5 is usually provided in a concave portion on the gap side of the pole pieces. The uniformity of the magnetic field of the uniform magnetic field space between the gap of the pole pieces can be intentionally, linearly disrupted by the inclined magnetic field coil. Provided that NMR signals including the non-uniform magnetic field are received at this time, spatial information can also be provided when the signal is converted to an image.

Moreover, the present invention also provides a permanent magnet piece that facilitates adjustment of the magnetic field. Namely, in the present invention, the magnetic field can be adjusted by arranging an adjustment permanent magnet 6 having a magnetic flux amount of at most $2\times10^{-7}$ Wb, so as to magnetically contact with the magnetic field formed in the gap between the pole pieces. As described above, since a permanent magnet piece is used in the present invention, the present invention is superior to the case in which a soft magnetic member is used in that it is possible to adjust so as to weaken the magnetic field by arranging the permanent magnetic piece in a direction opposite to the principal magnetic field.

Here, the adjustment permanent magnet has a magnetic flux amount of at most $2\times10^{-7}$ Wb (V·s), and preferably $1\times10^{-7}$ to $1\times10^{-8}$ Wb. Accordingly, by using permanent magnet pieces that have a small amount of magnetic flux, the magnetic field can be favorably linearly adjusted. Thus, when a plurality of adjustment permanent magnets is used, the magnetic field at the position at which they are used can be adjusted depending on their number. Therefore, if a plurality of permanent magnet pieces having a given amount of magnetic flux is prepared, then the magnetic field can be easily adjusted as required by controlling the number of adjustment permanent magnets.

Using a magnet piece that has a small amount of magnetic flux to adjust the magnetic field is equivalent, for example, to being able to make the surface smoother by using a finer grinding material when grinding the surface of metal. However, conventionally, the extent to which the size of the magnets should be reduced, and standards thereof have not been clearly shown. Therefore, there has been no guidance as to how magnet pieces having small magnetic flux amounts should be fabricated, and appropriate magnet pieces could not be prepared. And, the magnetic field has conventionally been adjusted by using magnets that can be managed by hand (in the order of 3 mm square: $5 \times 10^{-6}$ Wb for Nd—Fe—B magnets). In this case, since the amount of magnetic flux adjusted by a single magnet piece is large, there have been cases, for example, where it is desired to alter the magnetic flux by $1 \times 10^{-6}$ Wb, but the magnetic flux is altered by five times that amount, and there is the problem that the uniformity that is obtained cannot be increased by simple arrangement of a magnet piece alone. Conventionally, in such cases it has been necessary to go through a procedure such as affixing magnet pieces around the entire circumference of where it is desired to alter the magnetic flux, altering the magnetic flux completely. In this way, the magnetic field can be adjusted, since if the magnet pieces are placed at points slightly away from where it is desired to alter the magnetic flux, then the change in the magnetic flux can be made small. However, because the amount of magnetic flux at other points is then changed due to this, it becomes necessary to re-measure and redo the calculations. The present inventors have found that in order to make adjustments by simply arranging magnet pieces, it is preferable that the magnet pieces have a magnetic flux of at most $2 \times 10^{-7}$ Wb. If the amount of magnetic flux is smaller than this, then the uniformity can be improved but the magnet pieces may become small, and they may become difficult to manage by hand and difficult to manufacture.

On the other hand, when the smallest unit of the adjustment permanent magnet pieces is larger than $2 \times 10^{-7}$ Wb, the minim unit, that is, the amount of change in the magnetic field that is adjusted by a single adjustment permanent magnet piece, is too large, and there is the problem that it is difficult to finely adjust the uniformity. As described above, when a permanent magnet piece of a minimum unit conventionally used ($5 \times 10^{-6}$ Wb) is arranged in order to increase the magnetic field at a point in space by magnetic field adjustment, then in some instances the magnetic field was increased by too much, and the uniformity was instead worsened. In such cases, it became necessary to arrange more magnets in other parts so as to relatively weaken the part that it was desired to adjust. Thus, according to the present invention this necessity is eliminated, and the amount of magnet required for the adjustment permanent magnet pieces can be reduced.

The important points here are the minimum unit, namely, making the amount of magnetic flux of a single adjustment permanent magnet piece small, and establishing the conditions therefor. The present inventors have found as a result of investigations, that provided that the minimum unit of magnetic flux amount of the adjustment permanent magnet pieces used in the permanent magnet-type magnetic circuit is $2 \times 10^{-7}$ Wb or less, and is preferably $1 \times 10^{-7}$ to $1 \times 10^{-8}$ Wb, then the adjustment permanent magnet pieces are suitable for adjusting the magnetic field.

Furthermore, although permanent magnets are used, for used in the magnetic field, in some cases there is a possibility that they will suffer a reduction in magnetism caused by the principal magnetic field of the magnetic circuit. Particularly, since adjustment permanent magnets used in the present invention have comparatively small amounts of magnetic flux, the effect of reduction in magnetism is relatively large. Thus, the present inventors have also investigated this point, and have also found that, provided the coercive force of the permanent magnet pieces is preferably at least 800 kA/m, and is more preferably 1000 to 1200 kA/m, the problem of reduction in magnetism is less likely to occur.

When the coercive force of the permanent magnet material of the adjustment permanent magnet pieces is less than 800 kA/m, there may be cases in which problems such as a loss of magnetism due to the magnetic field of the generating apparatus occur, when using the magnets in a direction opposite to the principal magnetic field of the magnetic circuit, resulting in that desired adjustment cannot be achieved. Considering the possibility that the adjustment permanent magnet pieces may contact edge portions of the pole pieces of the magnetic circuit where the magnetic field is strong, it is further preferable that the coercive force is 1000 to 1200 kA/m.

For the adjustment permanent magnet pieces, any known type of magnet can be used without particular limitation, and any known method can be used in their manufacture. For example, a small sintered magnet can be used, and a sintered magnet whose magnetism has been reduced by heat and the like can also be used. Furthermore, it is also possible to use bond magnets, namely magnets made of permanent magnet powder packed with resin or the like, whose magnetism has been diluted.

Furthermore, there is no particular limitation to the magnetic material of the adjustment permanent magnet pieces. Any known magnetic material can be used, and it can be manufactured by any known method. However, rare earth magnets are generally used as magnet materials that have a high coercive force as described above, and it is preferable to use rare earth magnets called $Sm_2CO_{17}$-based or $Nd_2Fe_{14}B$-based rare earth magnets.

Furthermore, there is no particular limitation to the shape of the adjustment permanent magnet pieces and they can be prismatic, (eg, cubes and rectangles), cylindrical or spherical, selected as appropriate for the object of use. Furthermore, the adjustment permanent magnet piece may be a permanent magnet piece, such as sintered magnets, that are buried immovably in a case of non-magnetic material such as plastic, resin, rubber or glass, brass or aluminium. This is preferable since, even if the magnet piece is small, the adjustment permanent magnet pieces can be managed by hand by making the case large enough to be handled by hand. This is because, when sintered magnet pieces having a magnetic flux amount of $2 \times 10^{-7}$ Wb or less are to be fabricated, it is generally unavoidable that they are of a size of 1 mm or less, and are thus difficult to manage by hand.

In order to adjust the magnetic field of magnetic circuits by such an adjustment permanent magnet piece, it is necessary to arrange the adjustment permanent magnetic piece such that it is in magnetically contact with the magnetic field formed in the gap between the pole pieces (also referred to as the principal magnetic field). Here, magnetically contact with the principal magnetic field means a condition in which the permanent magnet piece is able to substantially influence the principal magnetic field, such that it can adjust, for example, the size or direction of the principal magnetic field.

Although not particularly limiting, more specifically, it is preferable that the adjustment permanent magnet pieces are arranged on the pole piece 4 or the inclined magnetic field coil 5 for example, namely, in a place such as between the pole piece 4 and the inclined magnetic field coil 5, or on the gap side face of the inclined magnetic field coil 5. Moreover, it is also possible to provide a holding member (not illustrated) for holding the adjustment permanent magnet piece, and to arrange the piece on this. In this case, the holding plate can be arranged in any suitable position, such as between the permanent magnet that forms the principal magnetic field of the magnetic circuit and the pole piece, between the pole piece and the inclined magnetic field coil, or on the gap side face of the inclined magnetic field coil. The holding member can have any shape, such as for example, plate-shaped or rod-shaped. Furthermore, it is not necessary that the position of the adjustment permanent magnets is vertical with respect to the evaluation space, namely, on the side of the permanent magnet 2, but rather they can be arranged to the side of the evaluation space (not illustrated).

There is no particular limitation to the attachment of the adjustment permanent magnets onto the pole pieces, inclined magnetic field coils or holding plates or the like, and it can be carried out by any known method. For example, the adjustment permanent magnets can be attached by a suitable adhesive, or they can be fastened by bolts, for example.

The magnetic field can be favorably adjusted by providing at least one, and preferably a plurality of such adjustment permanent magnet pieces. Although it is not a specific limitation, it is preferable that if a plurality of adjustment permanent magnets is provided, the magnetic flux amount thereof are the same. As described above, in the present invention, the magnetic field can be favorably linearly adjusted by using permanent magnet pieces having small magnetic flux amount, and a plurality of adjustment permanent magnet pieces can be used such that the magnetic field at the position in which they are used increases depending on the number of pieces.

Thus, according to the present invention, it is easy to adjust the magnetic field by the adjustment permanent magnet pieces described above, and moreover, the adjustment permanent magnet pieces described above can also be reliably used even in a reverse direction. Adjustment of the magnetic field, namely, determination of the position and amount of the adjustment permanent magnet pieces, can be the same as conventionally, and although it is not a specific limitation, it is preferable that the magnetic field is systematically adjusted with the aid of a computer. For adjustment with the aid of a computer, it is possible to use methods such as mathematical programming, linear programming and the 7-plane method. Of these, linear programming is suited to adjustment of the magnetic field of the present invention since an optimal answer can be obtained by linear programming with a relatively small amount of calculation, provided the difference in the initial value and target value is not large (for example, a difference of two orders of magnitude).

EXAMPLES

A working example of the present invention is described hereafter with reference to the attached drawing. Naturally, the working example that is described below does not limit the present invention.

In the present working example, the MRI magnetic circuit with opposing permanent magnets is provided with a magnetic field strength of 0.2 T and a vertical gap between inclined magnetic field coils of 400 mm. By such a magnetic circuit, the evaluation space was set to a region of a size of 350 mm diameter, and the magnetic field adjusted.

For the adjustment permanent magnetic pieces (shim magnets), $Nd_2Fe_{14}B$ magnets characterized by a residual magnetic flux density of 1.3 T and a coercive force of 1200 kA/m that have been cut to small magnet pieces and embedded in a piece of plastic to allow manipulation by hand, are used in the same number. For measuring the uniformity, the magnetic field strength at 134 points on the surface of the 350 mm diameter spherical body was measured using an NMR tesla meter, and the uniformity was defined as the difference between the maximum and minimum values.

Table 1 shows the relationship between an amount of magnetic flux of a single adjustment permanent magnet piece and the achieved uniformity of the magnetic field.

TABLE 1

| Shim magnet piece minimum flux unit (Wb) | achieved uniformity (ppm) |
| --- | --- |
| $2 \times 10^{-7}$ | 26 |
| $1 \times 10^{-6}$ | 60 |

In the MRI with a magnetic field strength of 0.2 T, it can be seen that since the uniformity of not more than 30 ppm is generally demanded, the minimum unit should be $2 \times 10^{-7}$ Wb. Furthermore, when a ferrite magnet whose coercive force is 240 kA/m ($2 \times 10^{-7}$ Wb) was used, magnetism was lost when it touched the pole piece of the MRI, and so could not be used.

As is made clear from the foregoing, the present invention reduces the magnet amount and improves the uniformity of the magnetic field strength by using an adjustment magnet piece of a minimum unit suitable for magnetic field adjustment.

It should be understood that the foregoing disclosure emphasizes certain specific embodiments of the invention and that all modifications or alternatives equivalent thereto are within the spirit and scope of the invention as set forth in the appended claims.

What is claimed is:

1. A magnetic circuit with opposing permanent magnets, comprising:
    a pair of permanent magnets opposing each other across a gap, the pair of permanent magnets being magnetized in thickness direction;
    a yoke magnetically coupled to the permanent magnets, and provided outside of the permanent magnets and the gap;
    a pair of pole pieces each arranged on a gap side of an opposing surface of each of the permanent magnets and having a peripheral projection in opposing direction; and
    an adjustment permanent magnet piece having magnetic flux amount of at most $2 \times 10^{-7}$ Wb provided so as to magnetically communicate with a magnetic field formed in the gap.

2. The magnetic circuit with opposing permanent magnets according to claim 1, wherein the adjustment permanent magnet piece has a coercive force of at least 800 kA/m.

3. A method for adjusting a magnetic field of a magnetic circuit with opposing permanent magnets, the magnetic circuit comprising:
    a pair of permanent magnets opposing each other across a gap, the pair of permanent magnets being magnetized in thickness direction;
    a yoke magnetically coupled to the permanent magnets, and provided outside of the permanent magnets and the gap; and
    a pair of pole pieces each arranged on a gap side of an opposing surface of each of the permanent magnets and having a peripheral projection in opposing direction, and
    the method comprising a step of:
    providing an adjustment permanent magnet piece having magnetic flux amount of at most $2 \times 10^{-7}$ Wb so as to magnetically communicate with a magnetic field formed in the gap.

* * * * *